(12) United States Patent
Yokota

(10) Patent No.: US 6,908,867 B2
(45) Date of Patent: Jun. 21, 2005

(54) METHOD OF MANUFACTURING A FERAM WITH ANNEALING PROCESS

(75) Inventor: Tatsuya Yokota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/460,248

(22) Filed: Jun. 13, 2003

(65) Prior Publication Data

US 2003/0235969 A1 Dec. 25, 2003

(30) Foreign Application Priority Data

Jun. 20, 2002 (JP) ........................... 2002-180602

(51) Int. Cl.[7] ............................................. H01L 21/31
(52) U.S. Cl. ........................... 438/781; 438/3; 257/295
(58) Field of Search ........................... 257/295; 438/3, 438/250, 393, 781

(56) References Cited

U.S. PATENT DOCUMENTS

| | | | | |
|---|---|---|---|---|
| 5,990,513 A | * | 11/1999 | Perino et al. | 257/315 |
| 6,436,850 B1 | * | 8/2002 | Morales | 438/781 |
| 6,509,593 B2 | | 1/2003 | Inoue et al. | |
| 6,635,528 B2 | * | 10/2003 | Gilbert et al. | 438/253 |
| 2001/0002273 A1 | * | 5/2001 | Joshi et al. | 427/62 |

FOREIGN PATENT DOCUMENTS

| | | |
|---|---|---|
| EP | 1 061 573 A2 | 12/2000 |
| EP | 1 189 262 A2 | 3/2002 |
| JP | 2001-60669 | 3/2001 |
| JP | 2002-9256 | 1/2002 |
| JP | 2002-94021 | 3/2002 |

OTHER PUBLICATIONS

Yang et al., Hydrogen barriers for $SrBi_2Ta_2O_9$–based ferroelectric memories, *Appl. Phys. Lett.*, 77 (Aug. 2000) 1372.*

Yang et al., Highly reliable ferroelectric memories using BLT thin films and robust integration schemes, *IEEE Electron Device Lett.*, 23 (Dec. 2002) 743.*

* cited by examiner

Primary Examiner—Michael S. Lebentritt
Assistant Examiner—Christian D. Wilson
(74) Attorney, Agent, or Firm—Westerman, Hattori, Daniels & Adrian, LLP (57) ABSTRACT

There are contained the steps of forming sequentially a first conductive film, a dielectric film, and a second conductive film on a first insulating film, forming an upper electrode of a capacitor by patterning the second conductive film, patterning the dielectric film to leave under the upper electrode, forming a lower electrode of the capacitor by patterning the first conductive film, covering the capacitor and the first insulating film with a second insulating film, and annealing at least one of the first insulating film and the second insulating film in an inert-gas atmosphere and then exposing the film to an $N_2O$ plasma.

15 Claims, 12 Drawing Sheets

N₂O PLASMA

FIG. 9

N₂ PLASMA

METHOD OF MANUFACTURING A FERAM WITH ANNEALING PROCESS

CROSS-REFERENCE TO RELATED APPLICATIONS

This application is based upon and claims priority of Japanese Patent Application No. 2002-180602, filed on Jun. 20, 2002, the contents being incorporated herein by reference.

BACKGROUND OF THE INVENTION

1. Field of the Invention

The present invention relates to a semiconductor device manufacturing method and, more particularly, a semiconductor device manufacturing method having a capacitor.

2. Description of the Prior Art

As the nonvolatile memory that can store information after the power supply is turned OFF, the flash memory or the ferroelectric memory (FeRAM) has been known.

The flash memory has the floating gate buried in the gate insulating film of the insulated-gate field effect transistor (IGFET), and stores information by accumulating the charge as stored information in the floating gate. The tunnel current must be passed through the gate insulating film to write/erase the information. Thus, the relatively high voltage is needed.

The FeRAM has the ferroelectric capacitor that stores the information by utilizing the hysteresis characteristic of the ferroelectric substance. In the ferroelectric capacitor, the ferroelectric film formed between the upper electrode and the lower electrode generates the polarization in response to the voltage value applied between the upper electrode and the lower electrode, and has the spontaneous polarization that holds the polarization after the applied voltage is removed. When the polarity of the applied voltage is inverted, the polarity of the spontaneous polarization is also inverted. The information can be read by detecting the polarity and the magnitude of the spontaneous polarization.

FeRAM has such an advantages that it can operate at the lower voltage than the flash memory and the high-speed loading can be achieved while saving a power.

Figure 1A:
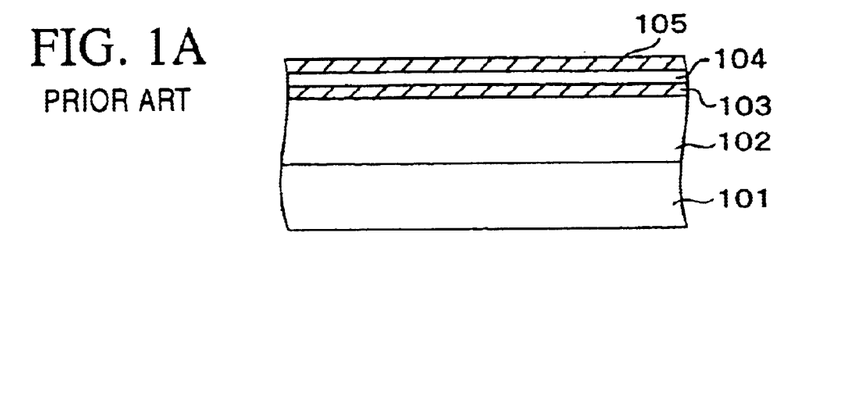
FIGS. 1A to 1C are sectional views showing steps of forming a ferroelectric capacitor in the prior art.
Figure 1B:
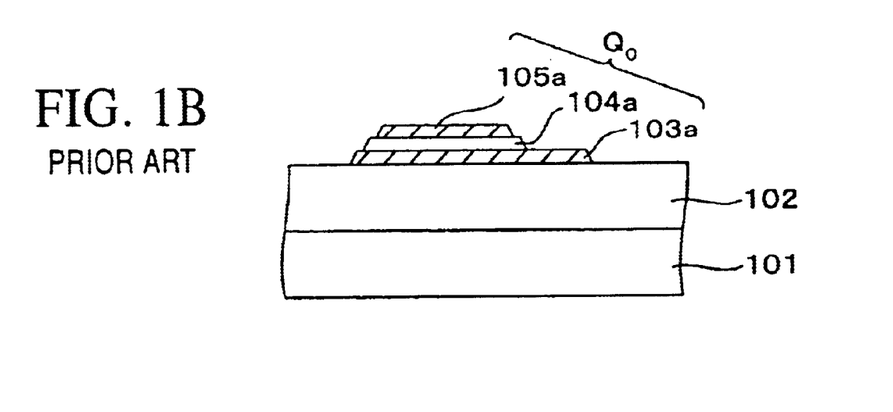
Figure 1C:
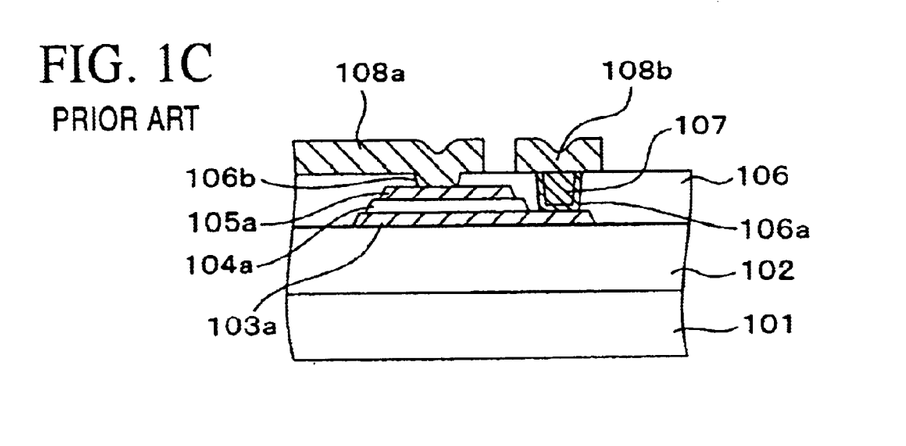

The planar ferroelectric capacitor employed in the memory cell of the FeRAM is formed by steps shown in FIGS. 1A to 1C, for example.

First, as shown in FIG. 1A, a first metal film 103, a ferroelectric film 104, and a second metal film 105 are formed on a first interlayer insulating film 102 that covers a silicon substrate 101. Then, as shown in FIG. 1B, an upper electrode 105a of a capacitor $Q_o$ is formed by patterning the second metal film 105, and then a dielectric film 104a of the capacitor $Q_o$ is formed by patterning the ferroelectric film 104. Then, a lower electrode 103a of the capacitor $Q_o$ is formed by patterning the first metal film 103. Then, as shown in FIG. 1C, the capacitor $Q_o$ is covered with a second interlayer insulating film 106 made of silicon oxide. Then, a first hole 106a is formed on the lower electrode 103a, and then a conductive plug 107 is formed in the first hole 106a. Then, a second hole 106b is formed on the upper electrode 105a. Then, a first wiring 108a, which is connected to the upper electrode 105a via the second hole 106b, and a second wiring 108b, which is connected to the conductive plug 107, are formed on the second interlayer insulating film 106 respectively.

As the material of the ferroelectric film 104 constituting the capacitor $Q_o$, normally ferroelectric oxide such as PZT is employed.

By the way, if the reducing substance is present around the ferroelectric film, there is such a possibility that writing/reading of the ferroelectric capacitor cannot be executed since the polarization characteristic of the ferroelectric film is deteriorated. Therefore, in the above steps, moisture, hydrogen, etc. in the interlayer insulating films 102, 106 cause the ferroelectric film 104 (104a) to deteriorate.

For such problem, as set forth in Patent Application Publication (KOKAI) 2001-60669, Patent Application Publication (KOKAI) 2002-9256, Patent Application Publication (KOKAI) 2002-94021, etc., for example, dehydration or reforming of the interlayer insulating film is executed by exposing such interlayer insulating film to the atmosphere in which $N_2O$, $N_2$ or NO is plasmanized.

However, in order to improve the electric characteristics of the ferroelectric capacitor much more, desorption of moisture from the interlayer insulating film to the ferroelectric capacitor must be prevented as much as possible.

SUMMARY OF THE INVENTION

It is an object of the present invention to provide a semiconductor device manufacturing method capable of reducing shift of moisture from an insulating film to a capacitor rather than the prior art.

According to one aspect of the present invention to provide a manufacturing method of a semiconductor device comprises the steps of: forming a first insulating film over a semiconductor substrate; forming a first conductive film, a dielectric film, and a second conductive film in order on the first insulating film; forming an upper electrode of a capacitor by patterning the second conductive film; patterning the dielectric film to leave under the upper electrode; forming a lower electrode of the capacitor by patterning the first conductive film; covering the capacitor and the first insulating film with a second insulating film; annealing at least one of the first insulating film and the second insulating film in an inert-gas atmosphere; and exposing at least one of the first insulating film and the second insulating film, which is annealed, to an $N_2O$ plasma.

According to the present invention, the insulating film formed on or under the capacitor is annealed in the inert gas atmosphere and then is exposed to the $N_2O$ plasma.

Therefore, the moisture contained in the insulating film is desorbed and also an amount of desorption of the moisture remained in the insulating film is reduced rather than the prior art. This is made clear by the experiment made by the inventors of the present invention.

If the processing order of the step of annealing the insulating film in the inert gas atmosphere and the step of exposing the insulating film to the $N_2O$ plasma is reversed from the present invention, an amount of hydration from the insulating film that is subjected to such processes was increased in contrast to the insulating film that is processed by the present invention.

Therefore, according to the present invention, an amount of moisture shifted from the insulating film to the capacitor by the annealing process executed after the capacitor is formed, e.g., the annealing process applied to improve the capacitor characteristics or the annealing process applied to form other insulating film is reduced, and thus degradation of the dielectric film constituting the capacitor is prevented.

DESCRIPTION OF THE PREFERRED EMBODIMENTS

An embodiment of the present invention will be explained with reference to the drawings hereinafter.

Figure 2A:
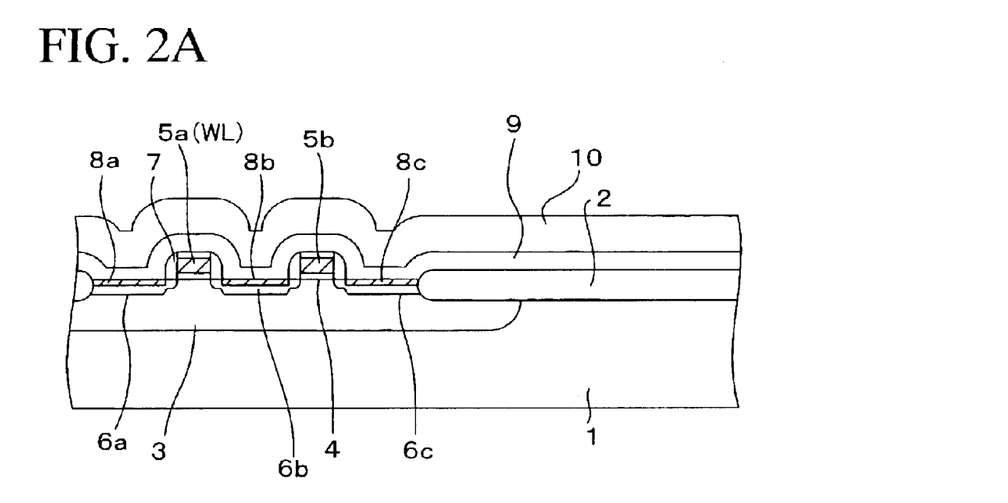
FIGS. 2A to 2O are sectional views showing a semiconductor device manufacturing method according to an embodiment of the present invention in order of step.
Figure 2B:
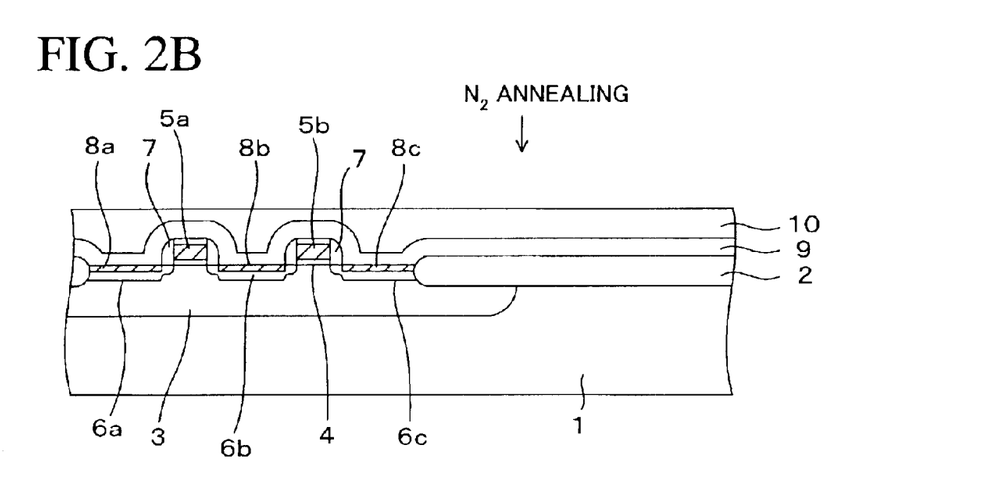
Figure 2C:
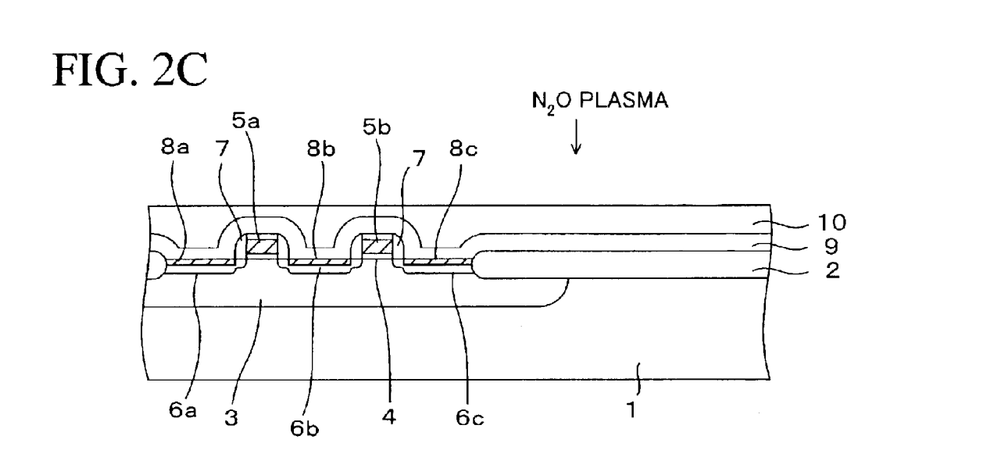
Figure 2D:
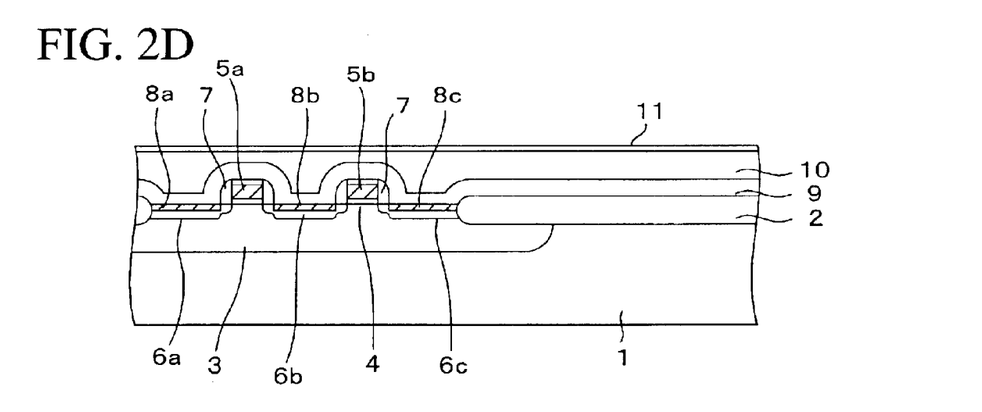
Figure 2E:
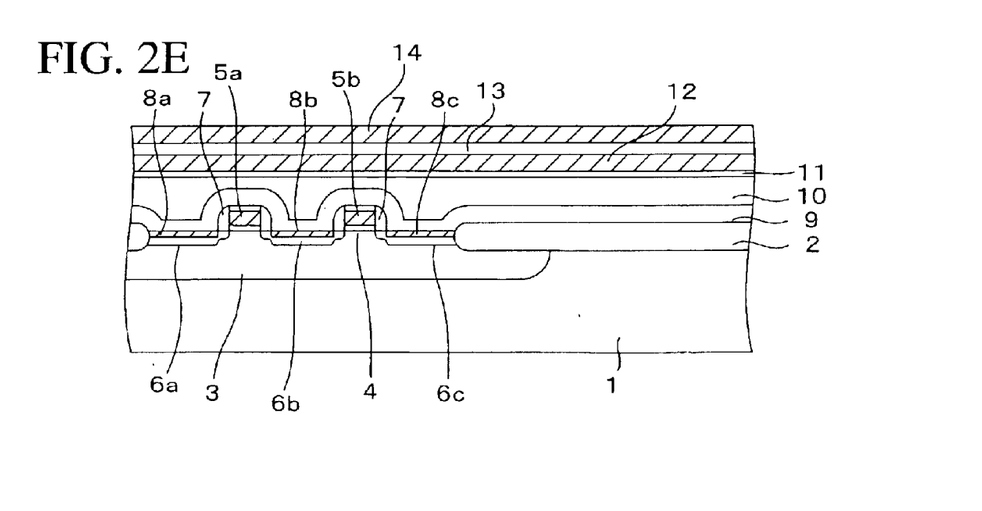
Figure 2F:
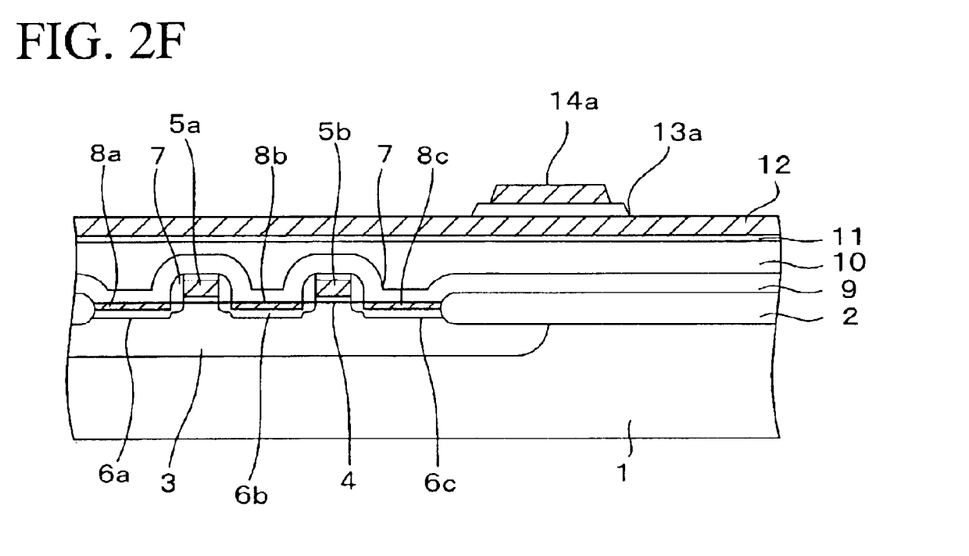
Figure 2G:
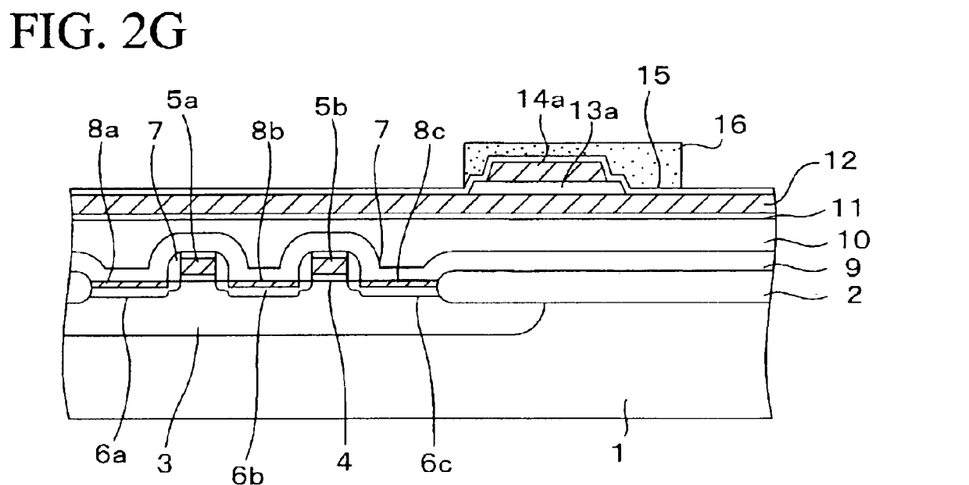
Figure 2H:
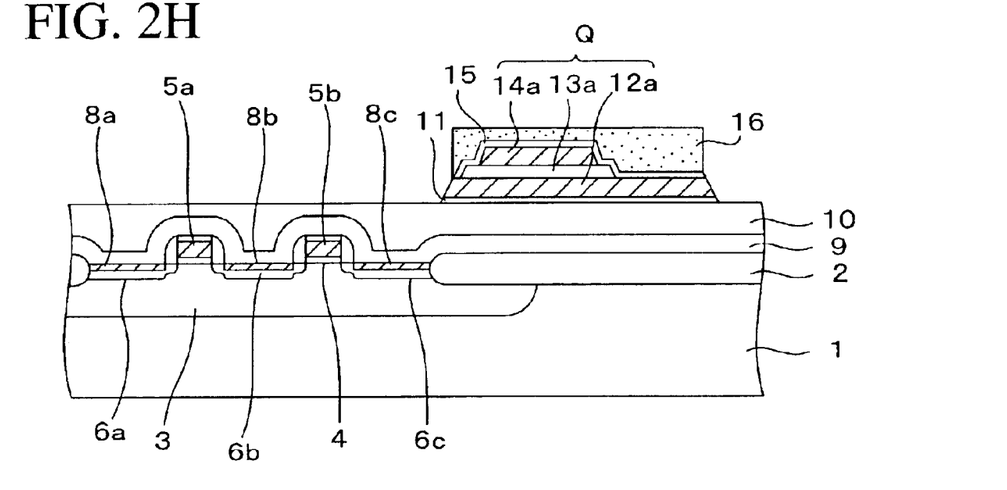
Figure 2I:
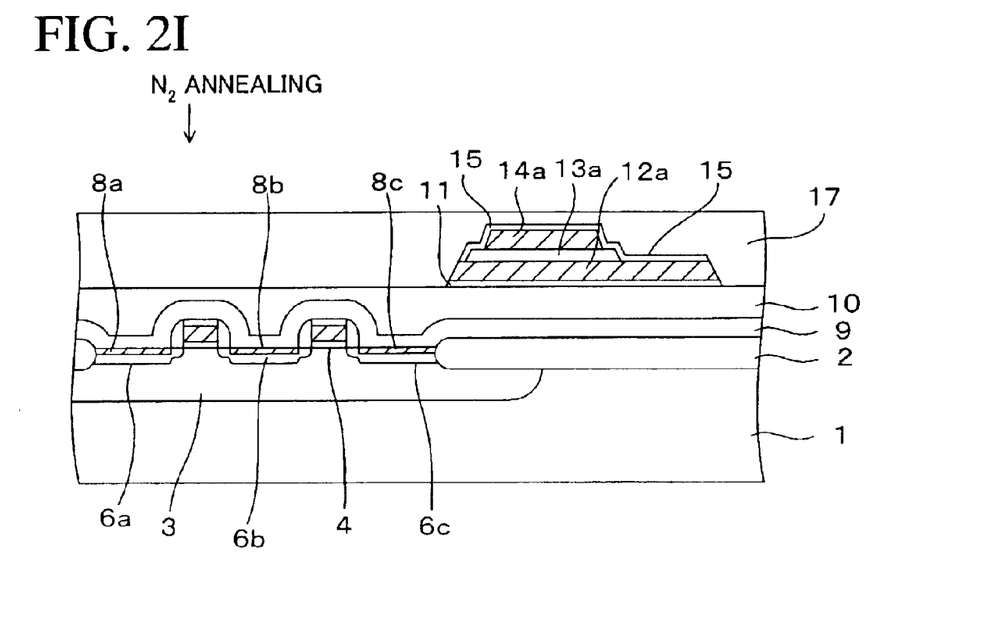
Figure 2J:
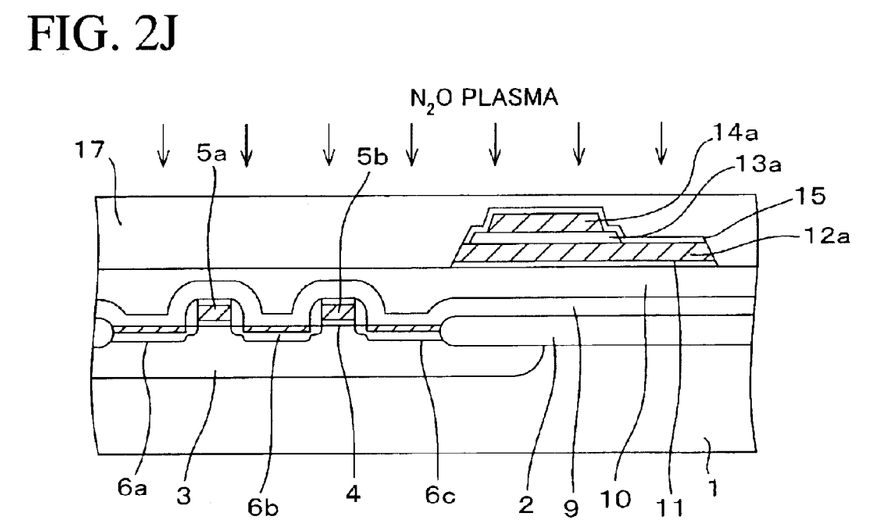
Figure 2K:
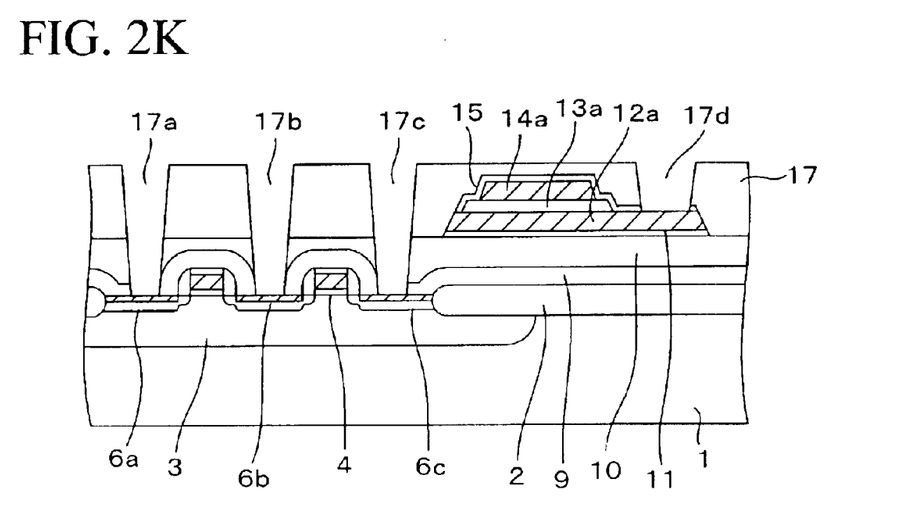
Figure 2L:
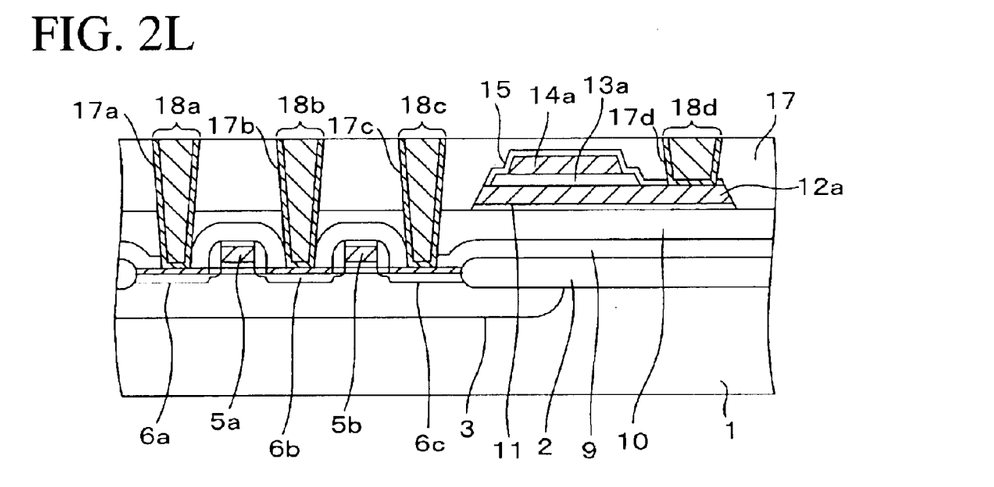
Figure 2M:
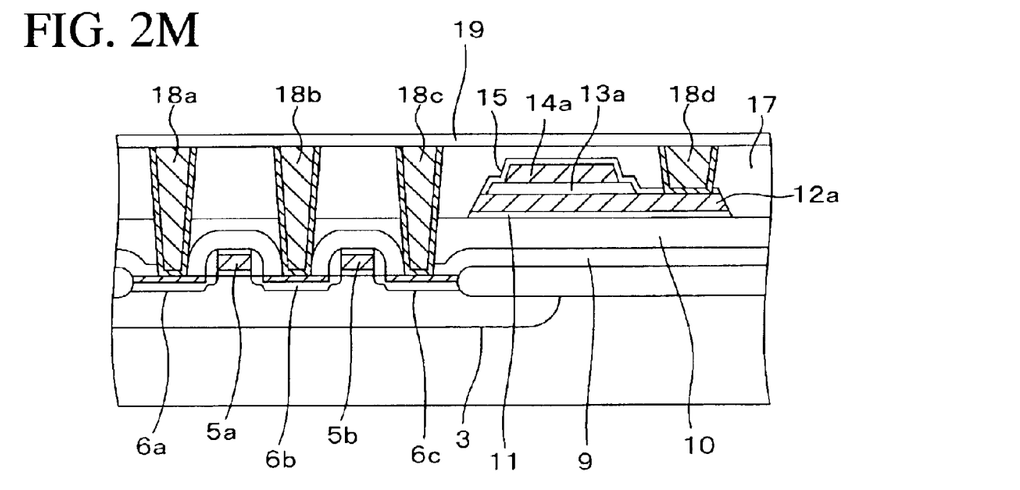
Figure 2N:
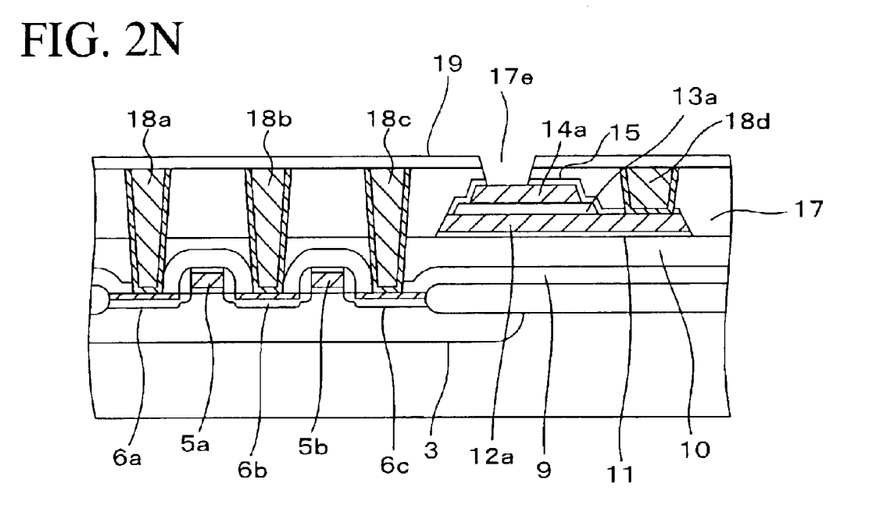
Figure 2O:
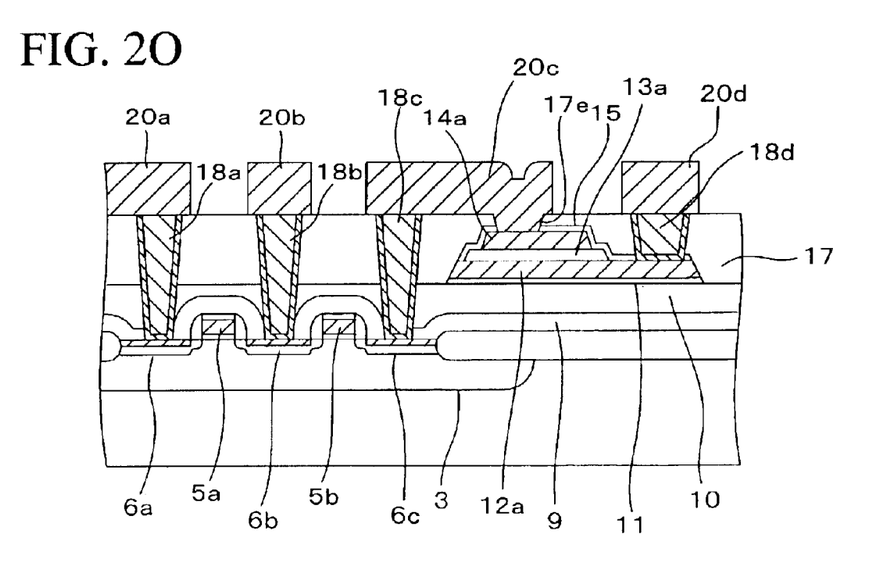

FIGS. 2A to 2O are sectional views showing a semiconductor device manufacturing method according to an embodiment of the present invention in order of step.

Next, steps required until a sectional structure shown in FIG. 2A is obtained will be explained hereunder.

First, an element isolation insulating film 2 is formed around an active region (transistor forming region) of an n-type or p-type silicon (semiconductor) substrate 1 by the LOCOS (Local Oxidation of Silicon) method. In this case, the STI (Shallow Trench Isolation) structure may be employed as the element isolation insulating film 2.

Then, a p-well 3 is formed by introducing the p-type impurity into the active region in the memory cell region on the silicon substrate 1. Then, a silicon oxide film is formed as a gate insulating film 4 by thermally oxidizing a surface of the active region on the silicon substrate 1.

Then, an amorphous silicon or polysilicon film and a tungsten silicide film are formed sequentially on the overall upper surface of the silicon substrate 1. Then, gate electrodes 5a, 5b are formed by patterning the silicon film and the tungsten silicide film by virtue of the photolithography method.

Two gate electrodes 5a, 5b are arranged in almost parallel at an interval on each p-well 3 in the memory cell region. These gate electrodes 5a, 5b constitute a part of the word line WL.

Then, n-type impurity diffusion regions 6a to 6c serving as the source/drain of the n-channel MOS transistor are formed by ion-implanting the n-type impurity into the p-well 3 on both sides of the gate electrodes 5a, 5b.

Then, an insulating film is formed on an overall surface of the silicon substrate 1, and then the insulating film is left as a sidewall insulating film 7 only on both side portions of the gate electrodes 5a, 5b by the etching-back. As the insulating film, a silicon oxide ($SiO_2$), for example, is formed by the CVD method.

Then, the n-type impurity is ion-implanted into the p-well 3 once again by using the gate electrodes 5a, 5b and the sidewall insulating films 7 as a mask. Thus, the n-type impurity diffusion regions 6a to 6c are formed into the LDD structure.

As described above, a first MOS transistor consisting of the p-well 3, the gate electrode 5a, the n-type impurity diffusion regions 6a, 6b, etc. and a second MOS transistor consisting of the p-well 3, the gate electrode 5b, the n-type impurity diffusion regions 6b, 6c, etc. are formed in the memory cell region.

Then, a refractory metal film is formed on the overall surface, and then refractory metal silicide layers 8a to 8c are formed on surfaces of the n-type impurity diffusion regions 6a to 6c respectively by heating this refractory metal film. Then, the unreacted refractory metal film is removed by the wet etching. As the refractory metal, there are cobalt, tantalum, etc.

Then, a silicon oxide nitride (SiON) film of about 200 nm thickness is formed as an oxidation-prevention insulating film 9 on the overall surface of the silicon substrate 1 by the plasma CVD method. Then, a silicon dioxide ($SiO_2$) film of about 600 nm thickness is grown as a first interlayer insulating film 10 on the oxidation-prevention insulating film 9 by the plasma CVD method using the TEOS gas.

Then, as shown in FIG. 2B, the first interlayer insulating film 10 is thinned by the CMP (Chemical Mechanical Polishing) method to planarize a surface thereof. An amount of polishing of the first interlayer insulating film 10 is set such that a thickness of about 785 nm is left on the element isolation insulating film 2.

The moisture in the slurry used in the planarization by the CMP method and the moisture in the cleaning solution used in the later cleaning adheres to the surface of the first interlayer insulating film 10 or is absorbed into the inside thereof.

For this reason, the silicon substrate 1 is put into the heating furnace. Then, in the state shown in FIG. 2B, the degassing is executed in the nitrogen atmosphere to remove the moisture in the first interlayer insulating film 10. As the conditions of the dehydration and the degassing, the nitrogen ($N_2$) is introduced into the heating furnace at 10000 to 50000 sccm, then the pressure is set at the atmospheric pressure and also the substrate temperature is set to 500 to 700° C., and then the annealing is carried out for 30 to 120 minute.

Then, the silicon substrate 1 is transferred from the heating furnace to the plasma equipment.

Then, as shown in FIG. 2C, the degassing is executed by annealing the first interlayer insulating film 10 in the atmosphere in which $N_2O$ is plasmanized. For example, the $N_2O$ plasma annealing is executed under the conditions such that $N_2O$ and $N_2$ are introduced into the plasma atmosphere at flow rates of 500 to 1000 sccm and 100 to 300 sccm respectively, the high-frequency power for generating the plasma is set to more than 300 W, the pressure in the plasma atmosphere is set to 1 to 5 Torr, the substrate temperature is set to 350 to 400° C., and the annealing time is set to about 2 minute. In this case, $N_2$ is not always introduced into the plasma atmosphere. According to the $N_2O$ plasma process, the nitrogen is contained in the first interlayer insulating film 10 deeply.

In this case, details of the $N_2$ annealing and the $N_2O$ plasma annealing will be described later.

Then, as shown in FIG. 2D, a titanium oxide film 11 having a rutile-type crystal structure is formed on the first interlayer insulating film 10. The titanium oxide film 11 is formed by forming a titanium film of about 20 nm thickness on the first interlayer insulating film 10 by virtue of the sputter method and then thermally oxidizing the titanium film. The thermal oxidation of the titanium film is executed at the substrate temperature of 700° C. for 60 second in the oxygen atmosphere by using the RTA (Rapid Thermal Annealing) equipment, for example. As a result, the oxidized titanium film is formed into the titanium oxide film 11 having a thickness of about 50 nm, and a (200) face appears on its upper surface.

Next, steps required until a structure shown in FIG. 2E is formed will be explained hereunder.

First, a platinum (Pt) film is formed as a first conductive film 12 on the titanium oxide film 11 by the sputter method. A thickness of the Pt film is set to about 100 to 300 nm, for example, 150 nm. Here, the titanium oxide film 11 performs a role of improving adhesiveness between the first conductive film 12 and the first interlayer insulating film 10. In this case, a titanium film and a platinum film may be formed instead of the titanium oxide film 11 and the first conductive film 12.

The first conductive film 12 is not limited to platinum. A noble metal film such as iridium, ruthenium, etc. or a noble metal oxide film such as ruthenium oxide, strontium ruthenium oxide ($SrRuO_3$), etc. may be employed as the first conductive film 12.

Then, a PLZT (Lead Lanthanum Zirconate Titanate; ($Pb_{1-3x/2}La_x$) ($Zr_{1-y}Ti_y$)$O_3$) of 100 to 300 nm, e.g., 180 nm, thickness is formed as a ferroelectric film 13 on the first conductive film 12 by the sputtering method.

In this case, as the method of forming the ferroelectric film 13, there are the MOD (Metal Organic Deposition) method, the MOCVD (Metal Organic CVD) method, the sol-gel method, etc. in addition to the above. Also, as the material of the ferroelectric film 13, there are other PZT material such as PLCSZT, PZT, etc., Bi-layered structure compound material such as $SrBi_2Ta_2O_9$, $SrBi_2(Ta,Nb)_2O_9$, etc., and other metal oxide ferroelectric substance in addition to PLZT.

Then, the PLZT film constituting the ferroelectric film 13 is crystallized by applying the RTA method in the oxygen-containing atmosphere. As the conditions of RTA, for example, 585° C., 90 second, and the programming rate of 125° C./sec are set. In this case, the oxygen and the argon are introduced into the oxygen-containing atmosphere and an oxygen concentration is set to 2.5%, for example.

In this case, in case DRAM is to be formed, a high-dielectric film such as (BaSr)$TiO_3$ (BST), strontium titanate (STO), etc. may be formed in place of the above ferroelectric film 13.

Then, an iridium oxide (IrO$_x$) film of 100 to 300 nm, e.g., 150 nm thickness is formed as a second conductive film 14 on the ferroelectric film 13 by the sputter method. In this case, a metal film such as a platinum film, a strontium ruthenium oxide (SRO) film, and others may be formed as the second conductive film 14 by the sputter method.

Then, the crystallinity of the ferroelectric film 13 is improved in the oxygen-containing atmosphere by the RTA. As the conditions of RTA, for example, 725° C., 20 second, and the programming rate of 125° C./sec are set. In this case, the oxygen and the argon are introduced into the oxygen-containing atmosphere and the oxygen concentration is set to 1.0%, for example.

Next, steps required until a structure shown in FIG. 2F is formed will be explained hereunder.

First, an upper electrode 14a of the capacitor Q is formed over the element isolation insulating film 2 near the first and second n-type impurity diffusion regions 6a, 6c by patterning the second conductive film 14 while using a resist pattern (not shown) by virtue of the photolithography method.

Then, the resist pattern is removed, and then the ferroelectric film 13 is annealed at the temperature of 650° C. for 60 minute in the oxygen atmosphere. This annealing is executed to recover a film quality from the damage of the ferroelectric film 13 caused by the sputtering and the etching.

Then, the ferroelectric film 13 is etched in the state that a resist pattern (not shown) is formed on the upper electrode 14a and its periphery in the memory cell region. Thus, the left ferroelectric film 13 is used as a dielectric film 13a of the capacitor Q. Then, the resist pattern is removed.

Then, as shown in FIG. 2G, a PZT film of about 20 nm thickness is formed as an encap layer 15 on the upper electrode 14a, the dielectric film 13a, and the first conductive film 12 by the sputtering method. The encap layer 15 is formed of PZT that has a function of protecting the dielectric film 13a, which is ready to reduce, from the hydrogen and traps easily the hydrogen because such PZT blocks the entering of the hydrogen thereinto. The encap layer 15 is a capacitor protection insulating film, and may be formed of the film such as an alumina film, a titanium oxide film, etc., which easily traps or blocks the hydrogen, in addition to the PZT film.

Then, the encap layer 15 is rapidly annealed at 700° C. for 60 second at the programming rate of 125° C./sec.

Then, resist 16 is coated on the encap layer 15. Then, the resist 16 is left on the upper electrode 14a and the dielectric film 13a and their peripheries by exposing/developing it.

Then, as shown in FIG. 2H, the encap layer 15, the first conductive film 12, and the titanium oxide film 11 are etched by using the resist 16 as a mask. Thus, the first conductive film 12 left below the upper electrode 14a is used as a lower electrode 12a of the capacitor Q.

Then, the resist 16 is removed. Then, the dielectric film 13a is recovered from the damage by executing the annealing at the temperature of 650° C. for 60 minute in the oxygen atmosphere.

As a result, the capacitor Q consisting of the lower electrode 12a, the dielectric film 13a, and the upper electrode 14a is formed on the first interlayer insulating film 10.

Then, as shown in FIG. 2I, a $SiO_2$ film of about 1500 nm thickness is formed as a second interlayer insulating film 17 on the encap layer 15, the capacitor Q, and the first interlayer insulating film 10. The second interlayer insulating film 17 may be formed by the CVD method using silane ($SiH_4$) or the plasma CVD method using TEOS, for example.

Then, a surface of the second interlayer insulating film 17 is planarized by the CMP method. The moisture in the slurry used in the planarization by the CMP method and the moisture in the cleaning solution used in the later cleaning adheres to the surface of the second interlayer insulating film 17 or is absorbed into the inside thereof.

For this reason, the second interlayer insulating film 17 is annealed in the heating furnace, into which $N_2$ is introduced, to discharge the moisture from the surface thereof and the inside thereof to the out side. After such dehydration process, as shown in FIG. 2J, the improvement in film quality of the insulating film 17 and the dehydration from the insulating film 17 is executed by exposing the second interlayer insulating film 17 to the N2O plasma.

Accordingly, deterioration of the capacitor Q caused by the heating and the moisture in the later steps is prevented. The conditions of the $N_2$ annealing and the $N_2O$ plasma annealing applied to the second interlayer insulating film 15 are set equal to those of the $N_2$ annealing and the $N_2O$ plasma annealing applied to the above first interlayer insulating film 10.

Then, as shown in FIG. 2K, the first interlayer insulating film 10, the second interlayer insulating film 17, and the encap layer 15 are patterned by the photolithography method. Thus, contact holes 17a to 17d are formed on the n-type impurity diffusion regions 6a to 6c in the p-well 3 and on the contact region of the lower electrode 11a respectively. The first interlayer insulating film 10, the second interlayer insulating film 17, and the oxidation-prevention insulating film 9 are etched by a CF gas, for example, a mixed gas that is obtained by adding Ar to $CF_4$.

At the time of this etching, the etching rate of the encap layer 15 for covering the capacitor Q and made of PZT is smaller than those of other insulating films. Therefore, the difference in the etching depths between the shallow contact hole 17d, which is formed on the lower electrode 12a, and other contact holes 17a to 17c is vanished at the time of etching of the encap layer 15.

Then, a titanium (Ti) film of 20 nm thickness and a titanium nitride (TiN) film of 50 nm thickness are formed as an adhesion layer on the second interlayer insulating film 17 and on inner surfaces of the contact holes 17a to 17d by the sputtering method. Then, a tungsten film is formed on the adhesion layer by the CVD method using a mixed gas consisting of tungsten hexafluoride ($WF_6$) gas, argon, and hydrogen. In this case, a silane ($SiH_4$) gas is also used in the initial growth of the tungsten film. The tungsten film has a thickness that is able to bury perfectly the contact holes 17a to 17d.

Then, as shown in FIG. 2L, the tungsten film and the adhesion layer on the second interlayer insulating film 17 are removed by the CMP method to leave only in the contact holes 17a to 17d. Thus, the tungsten film and the adhesion layer left in the contact holes 17a to 17d are used as first to fourth conductive plugs 18a to 18d respectively.

In this case, in each p-well 3, the second conductive plug 18b formed on the n-type impurity diffusion region 6b, which is put between two gate electrodes 5a, 5b, is connected electrically to the bit line formed thereover whereas the first and third conductive plugs 18a, 18c are connected electrically to the upper electrodes 14a of the capacitors Q via wirings described later.

Then, as shown in FIG. 2M, a SiON film of about 100 nm thickness, for example, is formed on the second interlayer insulating film 17 and the first to fourth conductive plugs 18a to 18d by the plasma CVD method. This SiON film is formed by using a mixed gas consisting of silane ($SiH_4$) and N2O, and used as an oxidation preventing film 19 that prevents the oxidation of the first to fourth conductive plugs 18a to 18d. Then, as shown in FIG. 2N, the oxidation preventing film 19, the second interlayer insulating film 17, and the encap layer 15 are patterned by the photolithography method. Thus, a contact hole 17e is formed on the upper electrode 14a of the capacitor Q.

Then, the film quality of the dielectric film 13a is improved by annealing the capacitor Q via the contact hole 17e at 550° C. for 60 minute in the oxygen atmosphere. In this case, the oxidation of the first to fourth conductive plugs 18a to 18d are prevented by the oxidation preventing film 19.

Then, the oxidation preventing film 19 is dry-etched by using the CF gas.

Then, a conductive film containing aluminum is formed on the second interlayer insulating film 17 and the conductive plugs 18a to 18d and in the contact hole 17e formed on the upper electrode 14a by the sputter method. Then, as shown in FIG. 2O, a wiring 20c for connecting electrically the third conductive plug 18c on the third n-type impurity diffusion region 6c to the upper electrode 14a of the capacitor Q via the contact hole 17e is formed by patterning the conductive film by means of the photolithography method. At the same time, a conductive pad 20b is formed on the second conductive plug 18b between two gate electrodes 5a, 5b on the p-well 3. Also, another conductive pad 20d is formed on the fourth conductive plug 18d on the lower electrode 12a of the capacitor Q. In addition, a wiring 20a connected to the upper electrode of another capacitor (not shown) is formed on the first conductive plug 18a.

Then, a third interlayer insulating film, a second-layer conductive plugs, the bit line, the cover film, etc. are formed, but their details will be omitted herein.

In this case, the $N_2O$ plasma annealing may be applied to at least one of the first interlayer insulating film 10 and the second interlayer insulating film 17 after the $N_2$ annealing is executed.

In the above embodiment, the dehydration process of the first interlayer insulating film 10 is executed by two steps such that the first interlayer insulating film 10 is annealed in the heating furnace, in which $N_2$ is introduced, and then such first interlayer insulating film 10 is exposed to the $N_2O$ plasma. This method is derived by the inventors of the present invention based on experimental results.

Next, experimental results about the effect of the dehydration process are shown in the following.

First, plural sheets of silicon substrates on each of which the silicon oxide film is formed by the CVD method are prepared.

Then, the silicon substrate having the silicon oxide film, to which both the annealing and the plasma process are not applied, thereon was prepared as a first sample. Also, the silicon substrate having the silicon oxide film that is annealed only in the heating furnace, into which $N_2$ is introduced, was prepared as a second sample. Also, the silicon substrate having the silicon oxide film, which is exposed only to the $N_2O$ plasma, was prepared as a third sample. Also, the silicon substrate having the silicon oxide film, which is exposed to the $N_2O$ plasma and then is annealed in the heating furnace into which $N_2$ is introduced, was prepared as a fourth sample. Also, the silicon substrate having the silicon oxide film, which is annealed in the heating furnace into which $N_2$ is introduced and then is exposed to the $N_2O$ plasma, was prepared as a fifth sample.

The annealing conditions of in the heating furnace into which $N_2$ is introduced were set identically in the second sample, the fourth sample, and the fifth sample, and 650° C. and the atmospheric pressure are used. Also, the conditions applied to expose to the $N_2O$ plasma were set identically in the third sample, the fourth sample, and the fifth sample, and the same conditions as those applied to the above first interlayer insulating film 10 were employed.

Figure 3:
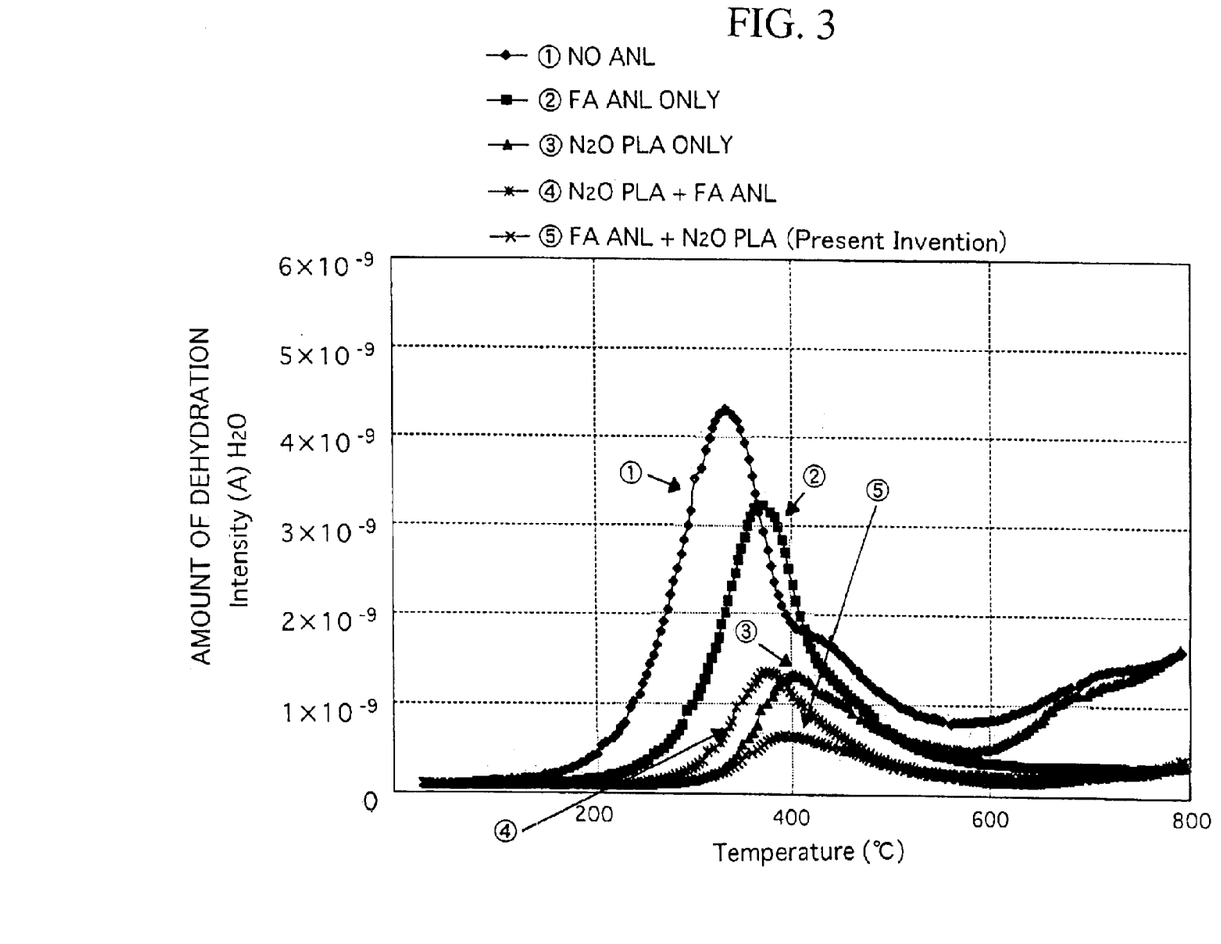
FIG. 3 is a view showing profiles of an amount of moisture in a silicon oxide film, which are measured by the TDS analysis based on difference in process conditions.

Then, when an amount of dehydration from the silicon oxide film was examined in the first to fifth samples by the thermal desorption spectroscopy (TDS) method, results shown in FIG. 3 were obtained. In FIG. 3, "NO ANL" denotes the first sample, "FA ANL ONLY" denotes the second sample, "$N_2O$ PLA ONLY" denotes the third sample, "N₂O PLA+FA ANL" denotes the fourth sample, and "FA ANL+N₂O PLA" denotes the fifth sample. Also, an abscissa of FIG. 3 denotes the substrate temperature in analysis by TDS, and an ordinate denotes equivalently an amount of dehydration.

According to FIG. 3, in the first sample, an amount of dehydration from the silicon oxide film, to which both the N₂ annealing process and the N₂O plasma process are not applied, was largest. This indicates the fact that the moisture is contained during the step of growing the silicon oxide film by the CVD method.

Also, in the second sample, an amount of dehydration from the silicon oxide film, to which only the N₂ annealing process was applied, was reduced, but was reduced merely by almost ¼ at the peak value with respect to the first sample.

In the third sample, an amount of dehydration from the silicon oxide film, to which only the N₂O plasma process was applied, was reduced by almost ¾ at the peak value with respect to the first sample. Therefore, such process was largely effective to desorb the moisture.

In the fourth sample, an amount of dehydration from the silicon oxide film, which was subjected to the N₂O plasma process and then was subjected to the N₂ annealing process, was reduced to the same extent as the third sample.

In contrast, in the fifth sample that was subjected to the N₂O plasma process and the N₂ annealing process in reverse order to the fourth sample, an amount of dehydration from the silicon oxide film was reduced to about ⅛ of the first sample at the peak value, and was reduced to less than half of the third and fourth samples.

In this case, although not particularly shown, an amount of dehydration from the silicon oxide film, to which only the N₂O plasma process was applied, measured by the TDS analysis become smaller than that of the silicon oxide film, to which the N₂ anneal plasma process was applied.

According to the above, it is appreciated that an amount of dehydration from the silicon oxide film can be reduced smallest by the process that was applied to the silicon oxide film of the fifth sample. This means the fact that, when the N₂O plasma process is applied to at least one of the silicon oxide films (insulating films) formed on and under the above capacitor after the N₂ anneal process, an amount of moisture shifted from the silicon oxide film is reduced to the smallest.

Figure 4:
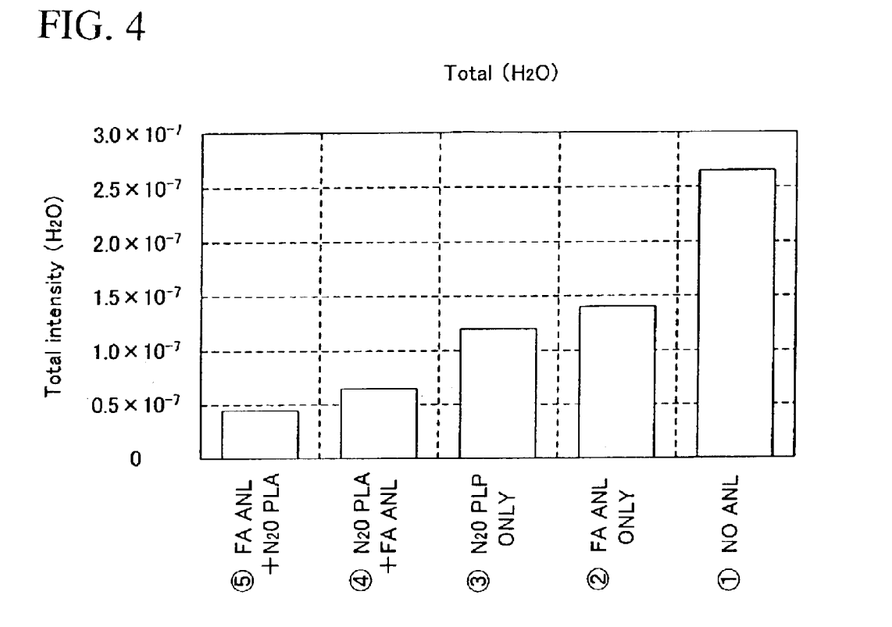
FIG. 4 is a bar graph showing a total amount of moisture in the silicon oxide film, which are measured by the TDS analysis based on difference in process conditions.

When a total amount of dehydration from the silicon oxide film measured by the TDS analysis shown in FIG. 3 was compared among the first sample to the fifth sample, results shown in FIG. 4 were obtained. An abscissa denotes the type of process applied to the sample, and an ordinate denotes an amount of dehydration equivalently.

According to FIG. 4, when a total amount of dehydration from respective samples in the course of increasing the temperatures of the first to fifth samples from the atmospheric temperature to 800° C. respectively was compared, a total amount of dehydration from the fifth sample that corresponds to the embodiment of the present invention was minimum.

Therefore, as for the interlayer insulating films 10, 17 formed on and under the capacitor, an amount of moisture shifted from the interlayer insulating films 10, 17 by the annealing executed after the formation of the capacitor Q is reduced extremely and thus deterioration in the characteristics of the capacitor Q by dehydrating is suppressed.

The inventors of the present invention formed the interlayer insulating film made of the silicon oxide film over the silicon substrate, then applied only the N₂ anneal process to the interlayer insulating film in the heating furnace, then formed a plurality of above capacitors Q on the interlayer insulating film, and then measured an amount of stored charge $Q_{sw}$ of the capacitors Q. In addition, the inventors of the present invention formed the interlayer insulating film made of the silicon oxide film over the silicon substrate, then applied the N₂ anneal and then the N₂O plasma anneal to the interlayer insulating film in the heating furnace, then formed a plurality of above capacitors Q on the interlayer insulating film, and then measured an amount of stored charge $Q_{sw}$ of the capacitors Q. In this case, the capacitor Q has a size of 50 μm×50 μm and a voltage applied to the capacitor is set to±3 V.

Figure 5:
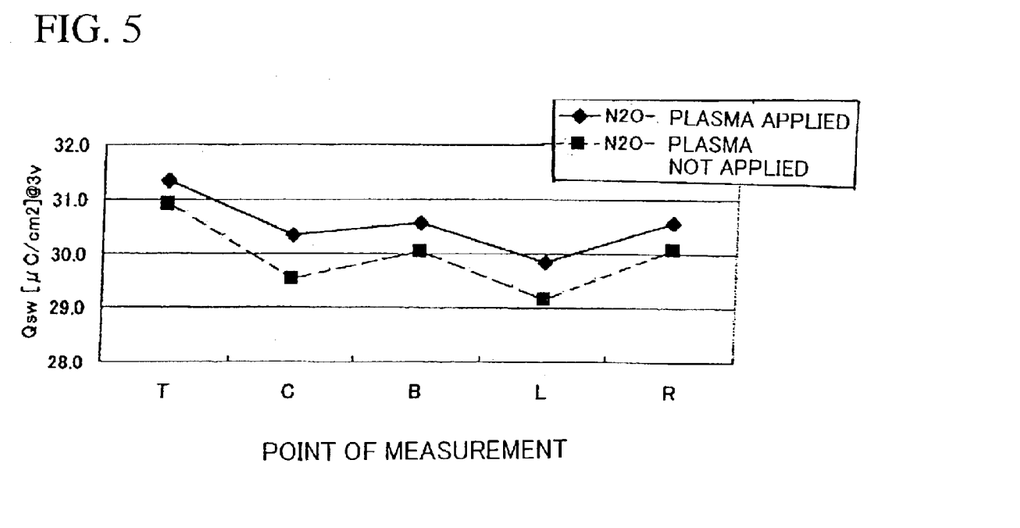
FIG. 5 is a view showing an amount of charge stored in a capacitor based on difference in process of an insulating film as an underlying film of the capacitor.

Measured results of an amount of stored charge $Q_{sw}$ are shown in FIG. 5. According to FIG. 5, it was found that the magnitude of the amount of stored charge $Q_{sw}$ becomes different depending on whether or not the N₂O plasma anneal is applied after the N₂ anneal is applied to the interlayer insulating film in the heating furnace and that an amount of stored charge $Q_{sw}$ is large when the interlayer insulating film is exposed to the N₂O plasma. As a result, it is appreciated that an amount of stored charge $Q_{sw}$ depends on an amount of dehydration from the interlayer insulating film.

T, C, B, L, and R in FIG. 5 denote top, center, bottom, left, and right positions of the silicon substrate with respect to the orientation flat thereof. The similar results were obtained at all positions.

Then, when it was examined by the SIMS analysis which difference is caused in the element distribution in the film by differentiating the processing method applied to the silicon oxide film, results shown in FIG. 6 to FIG. 9 were obtained. In this case, a thickness of the silicon oxide film is set to about 1000 nm.

Figure 6:
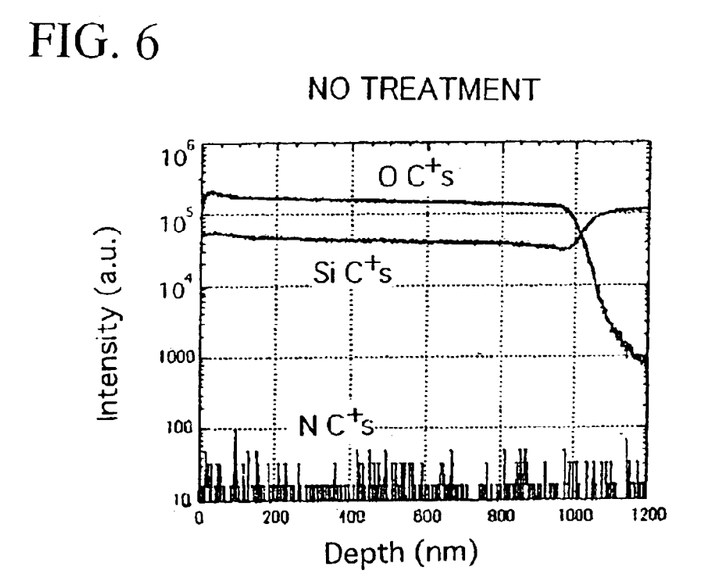
FIG. 6 is a view showing distributions of N, Si, O in the initial state of the silicon oxide film.
Figure 7:
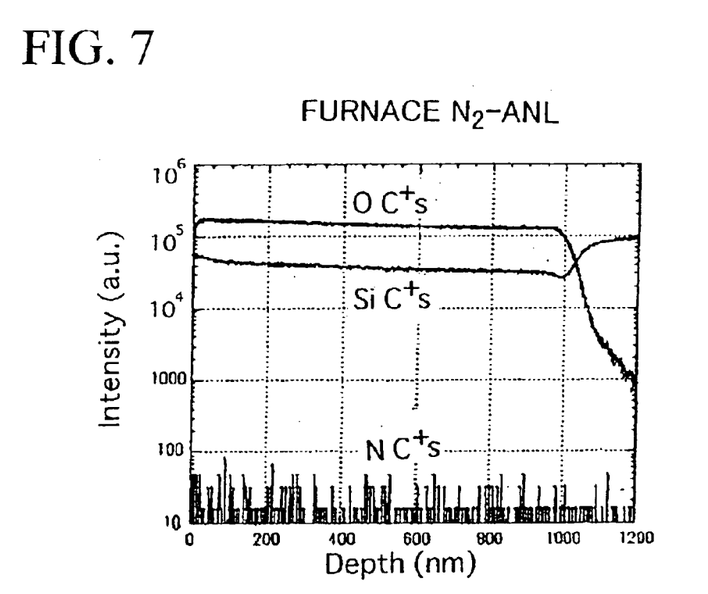
FIG. 7 is a view showing distributions of N, Si, O in the silicon oxide film that is subjected to $N_2$ annealing.
Figure 8:
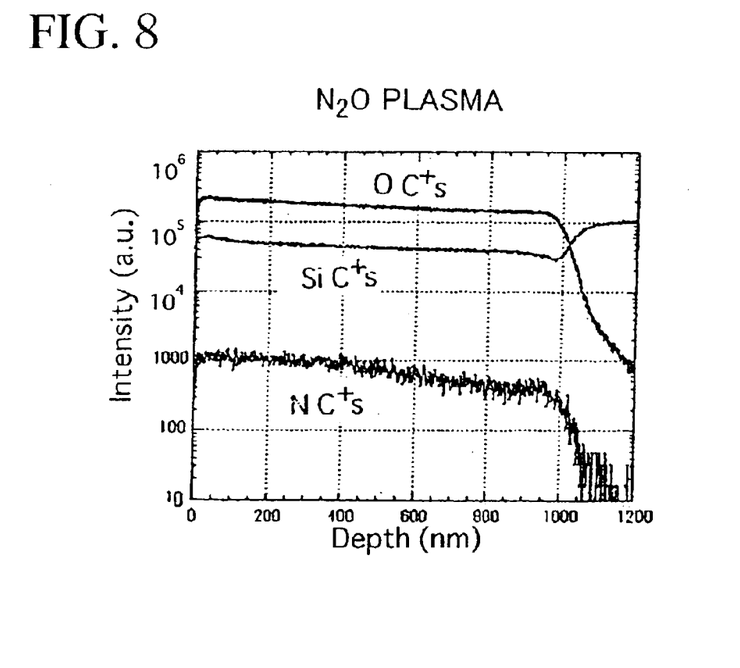
FIG. 8 is a view showing distributions of N, Si, O in the silicon oxide film that is subjected to $N_2O$ plasma annealing.
Figure 9:
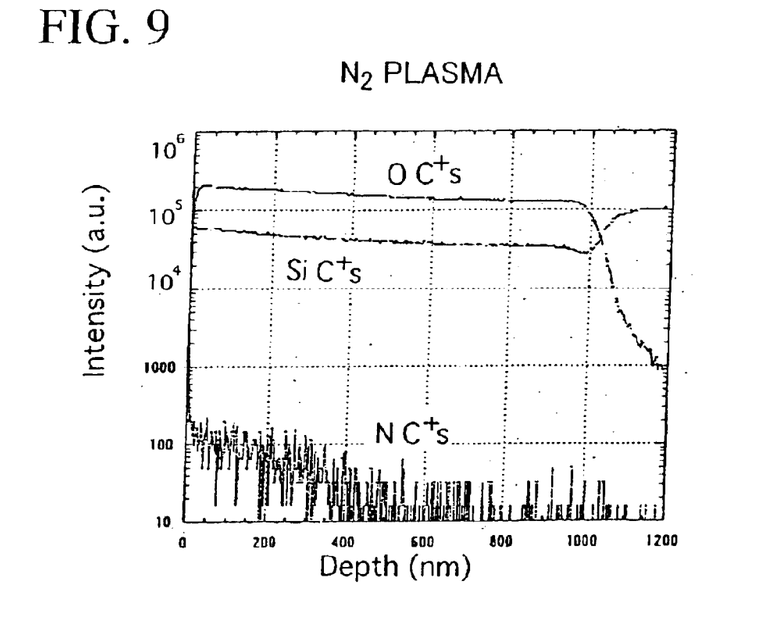
FIG. 9 is a view showing distributions of N, Si, O in the silicon oxide film that is subjected to $N_2$ plasma annealing.

FIG. 6 shows the SIMS analysis results of the silicon oxide film in the initial state in which the film is neither annealed nor exposed to the plasma. It was appreciated that a silicon (Si) distribution and an oxygen (O) distribution are large but a nitrogen (N) distribution is scarcely present. FIG. 7 shows the SIMS analysis results of the silicon oxide film after the film is annealed in the N₂ atmosphere in the heating furnace. The N, Si, and O distributions become almost equal to the initial state of the silicon oxide film. FIG. 8 shows the SIMS analysis results of the silicon oxide film that is exposed to the N₂O plasma. The Si and O distributions were similar to FIG. 6 and FIG. 7, but the N distribution appeared largely. Thus, the nitrogen was incorporated deeply and largely into the silicon oxide film. FIG. 9 shows the SIMS analysis results of the silicon oxide film that is exposed to the N₂ plasma. The nitrogen was incorporated only into the surface layer of the silicon oxide film more slightly than the initial state.

It was found based on comparison of FIG. 6 to FIG. 9 that the nitrogen was incorporated largely by exposing the silicon oxide film to the N₂O plasma, but the nitrogen was hardly incorporated by other methods even if the N₂ plasma is employed.

According to the above experiment, it may be considered that the moisture in the insulating film is drained off by the annealing in the inert gas atmosphere and an amount of dehydration of the insulating film is reduced by causing the nitrogen to incorporate into the insulating film by the subsequent N₂O plasma anneal, so that deterioration of the capacitor by the moisture is prevented.

In the above embodiment, the inert gas anneal and the N₂O plasma anneal are applied to the silicon oxide film.

Achievement of the above effect is not limited to the silicon oxide film. Such anneals are also effective for other insulating films containing the moisture, e.g., the silicon oxide film containing impurity.

In the above embodiment, the planar capacitor is formed on the first interlayer insulating film. But the stacked capacitor may be formed. In this case, the lower electrode of the stacked capacitor is connected to the n-type impurity diffusion region via the conductive plug formed in the first interlayer insulating film.

Also, the above interlayer insulating film may be formed by the CVD method or the excitation method using the thermal stimulation, the laser beam, or the like. As the film forming gas, there may be employed any one of polysilane compound such as $Si_2F_6$, $Si_3F_8$, $Si_2F_3Cl$, etc., silane ($SiH_4$), $SiF_4$, and TEOS or a mixed gas containing any of them.

As described above, according to the present invention, the insulating film formed on or under the capacitor is annealed in the inert gas atmosphere and then is exposed to the $N_2O$ plasma. Therefore, an amount of moisture shifted from the insulating film to the capacitor by the annealing process executed after the capacitor is formed, e.g., the annealing process applied to improve the capacitor characteristics or the annealing process applied to form other insulating film can be reduced, and thus degradation of the dielectric film constituting the capacitor can be prevented.

What is claimed is:

1. A manufacturing method of a semiconductor device comprising the steps of:
    forming a first insulating film over a semiconductor substrate;
    forming a first conductive film, a dielectric film, and a second conductive film in order on the first insulating film;
    forming an upper electrode of a capacitor by patterning the second conductive film;
    patterning the dielectric film to leave under the upper electrode;
    forming a lower electrode of the capacitor by patterning the first conductive film;
    covering the capacitor and the first insulating film with a second insulating film;
    annealing at least one of the first insulating film and the second insulating film in an inert-gas atmosphere; and
    exposing at least one of the first insulating film and the second insulating film, which is annealed, to an $N_2O$ plasma.

2. A manufacturing method of a semiconductor device according to claim 1, wherein the inert-gas atmosphere is an $N_2$ atmosphere.

3. A manufacturing method of a semiconductor device according to claim 1, wherein an annealing temperature in annealing at least one of the first insulating film and the second insulating film in the inert-gas atmosphere is set in a range of 500 to 700° C.

4. A manufacturing method of a semiconductor device according to claim 1, wherein a pressure in the inert-gas atmosphere is an atmospheric pressure.

5. A manufacturing method of a semiconductor device according to claim 1, wherein the inert-gas atmosphere is formed in a furnace.

6. A manufacturing method of a semiconductor device according to claim 1, further comprising the step of:
    planarizing at least one surface of the first insulating film and the second insulating film before annealing is executed in the inert-gas atmosphere.

7. A manufacturing method of a semiconductor device according to claim 6, wherein the surface is planarized by a chemical mechanical polishing method.

8. A manufacturing method of a semiconductor device according to claim 1, wherein an $N_2$ plasma is contained in the $N_2O$ plasma.

9. A manufacturing method of a semiconductor device according to claim 1, wherein the semiconductor substrate is heated at 350 to 400° C. in exposing at least one of the first insulating film and the second insulating film to the $N_2O$ plasma.

10. A manufacturing method of a semiconductor device according to claim 1, wherein a pressure of the atmosphere in which the $N_2O$ plasma is generated is set in a range of 1 to 5 Torr.

11. A manufacturing method of a semiconductor device according to claim 1, wherein the dielectric film is a film that contains lead zirconate titanate or Bi-layered structure compound.

12. A manufacturing method of a semiconductor device according to claim 1, wherein a titanium film or a titanium oxide film is formed between the lower electrode and the first insulating film.

13. A manufacturing method of a semiconductor device according to claim 1, further comprising the step of:
    forming a capacitor protection insulating film to cover the capacitor before the second insulating film is formed.

14. A manufacturing method of a semiconductor device according to claim 13, wherein the capacitor protection insulating film is formed of any one of a lead zirconate titanate film, an alumina film, and a titanium oxide film.

15. A manufacturing method of a semiconductor device according to claim 1, wherein a transistor that is covered with the first insulating film is formed on the semiconductor substrate.

* * * * *